US012568817B2

(12) United States Patent
Yang et al.

(10) Patent No.: US 12,568,817 B2
(45) Date of Patent: Mar. 3, 2026

(54) SURFACE FUNCTIONALIZATION OF SINX THIN FILM BY WET ETCHING FOR IMPROVED ADHESION OF METAL-DIELECTRIC FOR HSIO

(71) Applicant: Intel Corporation, Santa Clara, CA (US)

(72) Inventors: Yi Yang, Gilbert, AZ (US); Rahul N. Manepalli, Chandler, AZ (US); Suddhasattwa Nad, Chandler, AZ (US); Marcel Wall, Phoenix, AZ (US); Benjamin Duong, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 814 days.

(21) Appl. No.: 17/707,351

(22) Filed: Mar. 29, 2022

(65) Prior Publication Data

US 2023/0317614 A1     Oct. 5, 2023

(51) Int. Cl.
| | |
|---|---|
| *H05K 1/03* | (2006.01) |
| *H01L 21/48* | (2006.01) |
| *H01L 23/532* | (2006.01) |
| *H05K 1/11* | (2006.01) |

(52) U.S. Cl.
CPC ...... *H01L 23/5329* (2013.01); *H01L 21/4857* (2013.01); *H01L 21/486* (2013.01); *H01L 23/53228* (2013.01); *H05K 1/036* (2013.01); *H05K 1/111* (2013.01); *H05K 2201/0145* (2013.01); *H05K 2201/0195* (2013.01)

(58) Field of Classification Search
CPC ...... H05K 1/0346; H05K 1/036; H05K 1/111; H05K 2201/0145; H05K 2201/0195; H01L 23/5329; H01L 23/53228; H01L 23/49822; H01L 23/145; H01L 23/49894; H01L 21/486; H01L 21/4857
See application file for complete search history.

(56) References Cited

U.S. PATENT DOCUMENTS

| | | | | |
|---|---|---|---|---|
| 5,625,022 | A | 4/1997 | Onishi | |
| 2003/0015342 | A1 | 1/2003 | Sakamoto | |
| 2009/0056994 | A1* | 3/2009 | Kuhr | H05K 3/389 |
| | | | | 118/58 |
| 2010/0215927 | A1 | 8/2010 | Tseng | |
| 2016/0060489 | A1 | 3/2016 | Kim | |
| 2018/0166372 | A1* | 6/2018 | Shimizu | H05K 3/4644 |
| 2019/0371621 | A1* | 12/2019 | Darmawikarta | H01L 21/486 |

(Continued)

OTHER PUBLICATIONS

Office Action from U.S. Appl. No. 17/707,358, mailed Jun. 26, 2025, 17 pgs.

(Continued)

*Primary Examiner* — Roshn K Varghese
(74) *Attorney, Agent, or Firm* — Schwabe, Williamson & Wyatt, P.C.

(57) ABSTRACT

Embodiments disclosed herein include an electronic package. In an embodiment, the electronic package comprises a package substrate with a plurality of first layers, where the first layers comprise an organic material. In an embodiment, a trace is embedded in the package substrate, and a second layer is over the trace, where the second layer comprises silicon and nitrogen. In an embodiment, the second layer is chemically bonded to the one of the first layers.

11 Claims, 13 Drawing Sheets

(56)                     References Cited

U.S. PATENT DOCUMENTS

| | | | | | |
|---|---|---|---|---|---|
| 2020/0235039 | A1 | | 7/2020 | Kim | |
| 2020/0365533 | A1 | * | 11/2020 | Manepalli | ......... H01L 23/53233 |
| 2022/0181235 | A1 | | 6/2022 | Huang | |
| 2023/0269872 | A1 | * | 8/2023 | Kim | .................... H05K 1/0306 |
| | | | | | 174/258 |

OTHER PUBLICATIONS

Office Action from U.S. Appl. No. 17/707,371, mailed Sep. 5, 2025, 14 pgs.

* cited by examiner

SURFACE FUNCTIONALIZATION OF SINX THIN FILM BY WET ETCHING FOR IMPROVED ADHESION OF METAL-DIELECTRIC FOR HSIO

TECHNICAL FIELD

Embodiments of the present disclosure relate to electronic packages, and more particularly to electronic packages with smooth copper traces and a surface functionalized adhesion layer between the copper trace and the dielectric.

BACKGROUND

The improving performance demand in semiconductor packaging applications has been driving the package transmission line to operate at high frequencies and to maintain the package insertion loss budget. These requirements for next generation high-speed input/output (HSIO) drives the need for low roughness copper surfaces. The current method to provide adhesion between the organic dielectric and the underlying copper is to roughen the copper surface and to provide mechanical anchors for which the laminated dielectric can mechanically adhere.

However, it is to be appreciated that roughening the copper makes insertion loss worse at high frequencies. This is because the roughness may be on the same scale as the skin depth of the copper traces. That is, the majority of the signal passes over the surfaces of the copper traces, and must deal with the roughened surface. In addition to insertion loss issues, resistance is also generally increased. Accordingly, it is desirable to use copper traces that have smooth surfaces. Unfortunately, the smooth surface of the copper leads negatively impacts the adhesion strength between the copper and the overlying dielectric. This may lead to delamination issues when smooth copper surfaces are used.

EMBODIMENTS OF THE PRESENT DISCLOSURE

Described herein are electronic packages with smooth copper traces and a surface functionalized adhesion layer between the copper trace and the dielectric, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, high-speed input/output (HSIO) applications require low insertion loss. Accordingly, traditionally used surface roughening techniques in order to improve the adhesion between the dielectric layer and the copper are not suitable. As such, embodiments disclosed herein include adhesion promoting layers that improve the adhesion between the copper and the dielectric layer. Additionally, the adhesion promoting layers described herein include surface functionalizations in order to improve the adhesion strength. The functionalized surfaces allow for covalent bonding between the adhesion promoting layer and the dielectric. This increased bond strength (compared to hydrogen bonds in existing solutions) allows for a more robust structure. Particularly, the structure is resistant to wet etching chemistries used during desmear processes. This simplifies the process flow and reduces the cost of fabricating the electronic package.

Figure 1A:
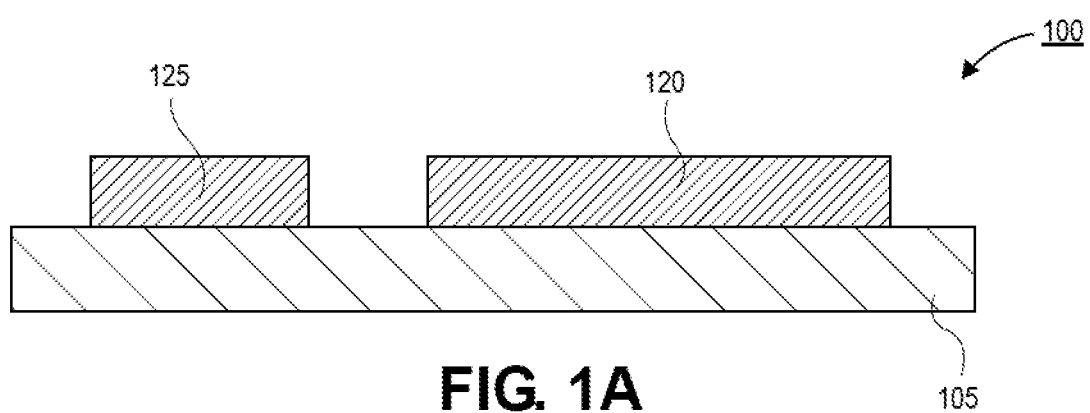
FIGS. 1A-1G are cross-sectional illustrations depicting a process for forming a via over a trace that is roughened, in accordance with an embodiment.

Referring now to FIGS. 1A-1G, a series of cross-sectional illustrations depicting a traditional surface roughening process used in electronic package fabrication is shown, in order to provide context for embodiments described in greater detail below. As shown in FIG. 1A, the electronic package 100 may include a dielectric layer 105. The dielectric layer 105 may be the first dielectric layer 105 or there may be other dielectric layers below the first dielectric layer 105. In some instances, a package core (not shown) may be provided below the first dielectric layer 105. The dielectric layer 105 may be an organic material. For example, the first dielectric layer 105 may comprise an epoxy or the like.

A trace 125 and a trace 120 may be provided over the first dielectric layer 105. As shown, the trace 125 extends into and out of the plane of FIG. 1A. The trace 120 may be coupled to a trace (not shown) over the first dielectric layer 105. For example, the trace coupled to the trace 120 may extend into the plane of FIG. 1A. The traces 125 and 120 may comprise an electrically conductive material. For example, the traces 125 and 120 may comprise copper or the like.

Figure 1B:
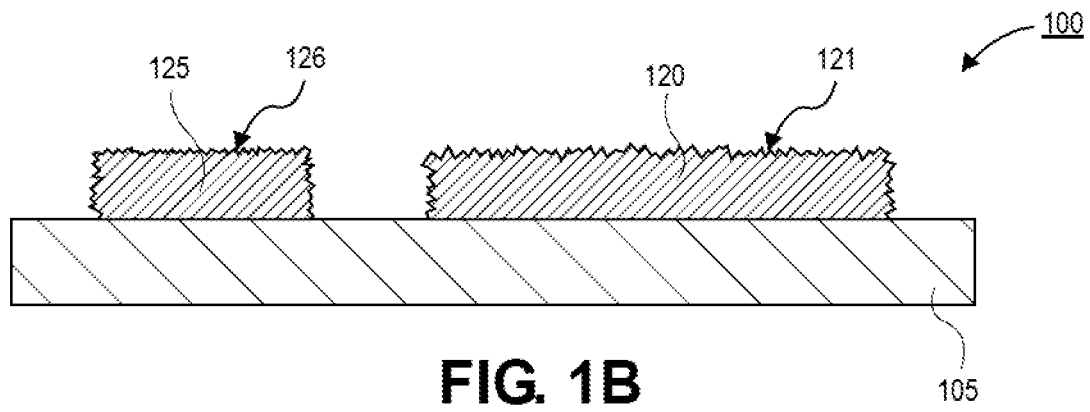

Referring now to FIG. 1B, a cross-sectional illustration of the electronic package 100 after a surface roughening process is shown. The surface roughening process may result in the exposed surfaces (i.e., sidewall surfaces and a top surface) of the trace 125 and the trace 120 being roughened. As shown, surface 121 of the trace 120 is roughened, and surface 126 of the trace 125 is roughened. The roughened surfaces may be used to provide mechanical anchors onto which a subsequent dielectric layer can mechanically couple to in order to provide improved adhesion between the metal and the dielectric layer. In some instances the surface roughening process may be implemented with a wet etching process or the like.

As noted above, the roughening of the surfaces 121 and 126 results in a decrease in the electrical performance of the trace 120 and the trace 125. For example, insertion loss is increased and the resistance is increased, especially at high frequency signals (e.g., for HSIO applications). The decrease in performance is partially attributable to the small skin depth of high frequency signals. Since the signal propagates mostly along the surface region of the trace 125 and the trace 120, the signal needs to navigate the roughened surface, which is more difficult than if the surface was substantially smooth.

Figure 1C:
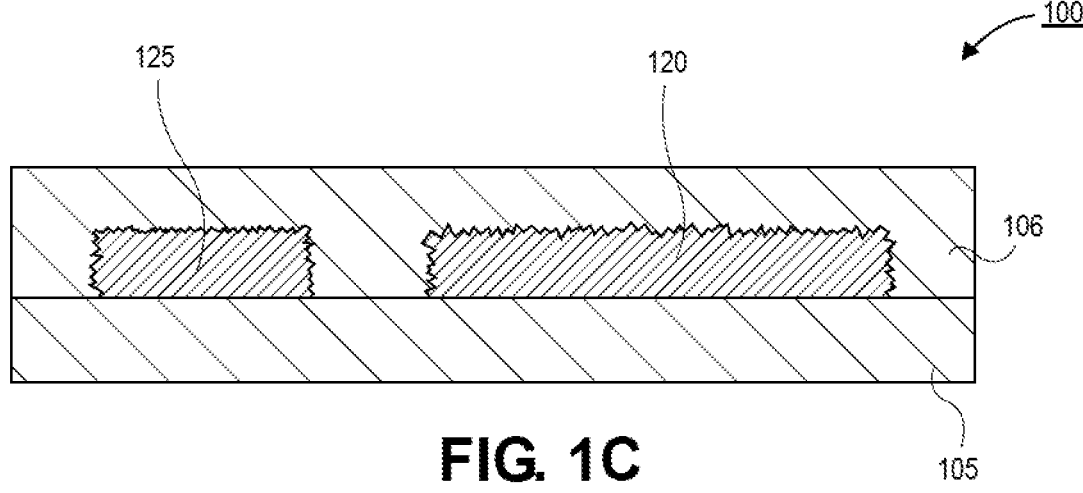

Referring now to FIG. 1C, a cross-sectional illustration of the electronic package 100 after a second dielectric layer 106 is provided over the trace 125 and the trace 120 is shown. In some instances, the second dielectric layer 106 may be laminated over the conductive features and the first dielectric layer 105. The second dielectric layer 106 may be substantially similar to the first dielectric layer 105. For example, the second dielectric layer 106 may be an organic material, such as an epoxy or the like.

As shown, the second dielectric layer 106 conforms to the roughened surfaces 121 and 126 of the conductive features. The conformal nature of the second dielectric layer 106 allows for the second dielectric layer 106 to mechanically couple to the surfaces of the conductive features 120 and 125. As such, adhesion strength between the two materials is improved.

Figure 1D:
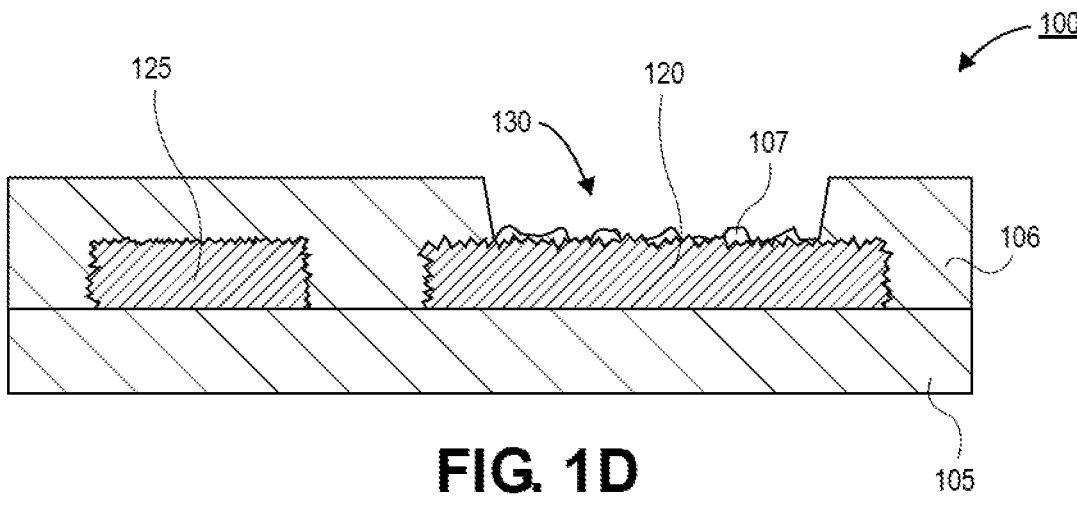

Referring now to FIG. 1D, a cross-sectional illustration of the electronic package 100 after a via opening 130 is formed through the second dielectric layer 106 is shown. The via opening 130 may be fabricated with a laser drilling process. Though, it is to be appreciated that other material removal processes may be used to form the via opening 130. In instances where a laser drilling process is used, the sidewalls of the via opening 130 may be tapered. In an embodiment, the laser drilling process may result in residual portions 107 of the second dielectric layer 106 remaining on the surface of the trace 120.

Figure 1E:
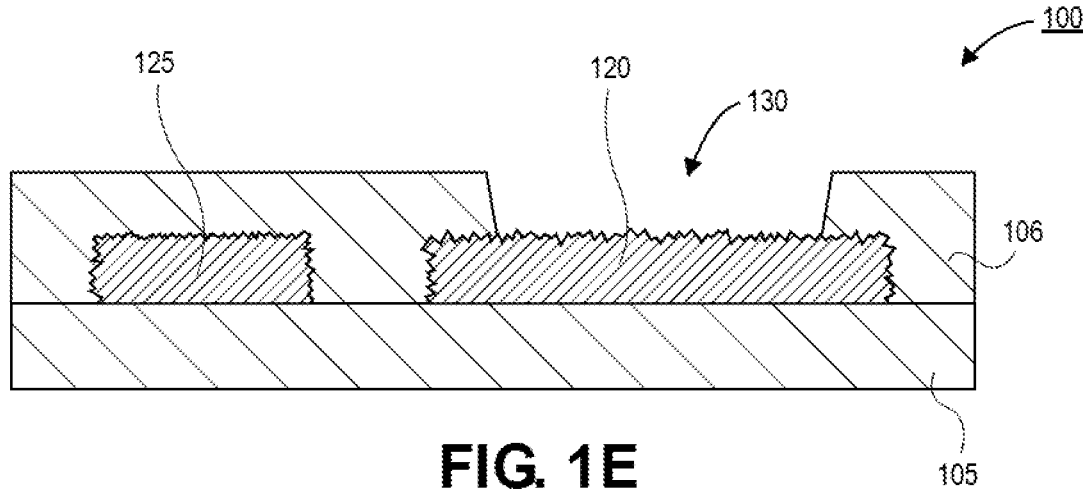

Referring now to FIG. 1E, a cross-sectional illustration of the electronic package 100 after a desmear process is shown. The desmear process may clear any residual portions 107 of the second dielectric layer 106 and fully expose regions of the trace 120. The desmear process may be a wet etching process or a dry etching process.

Figure 1F:
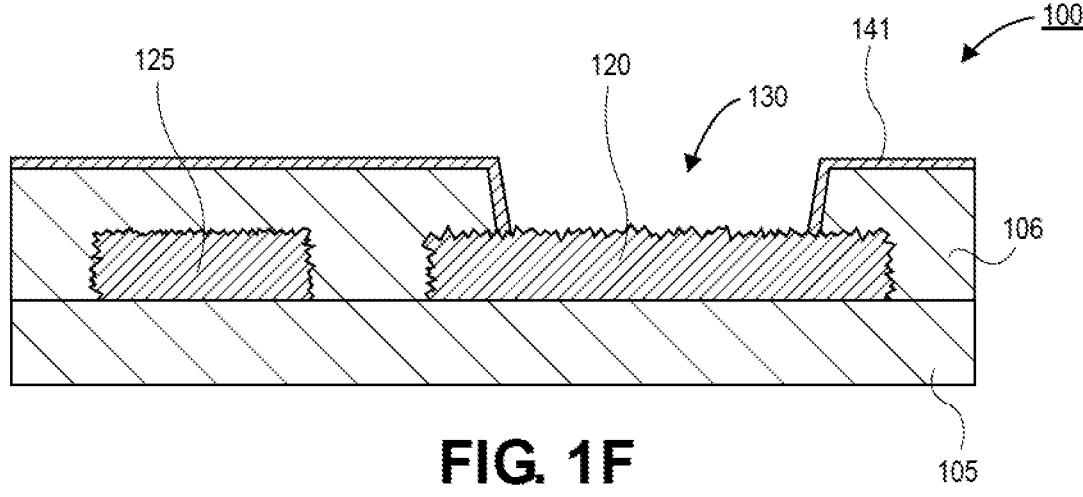

Referring now to FIG. 1F, a cross-sectional illustration of the electronic package 100 after a seed layer 141 is deposited over the second dielectric layer 106 is shown. The seed layer 141 may be a copper seed layer 141. Though, it is to be appreciated that other seed layer materials may also be used. In an embodiment, the seed layer 141 is provided over the top surface of the second dielectric layer 106 and over the sidewalls of the via opening 130.

Figure 1G:
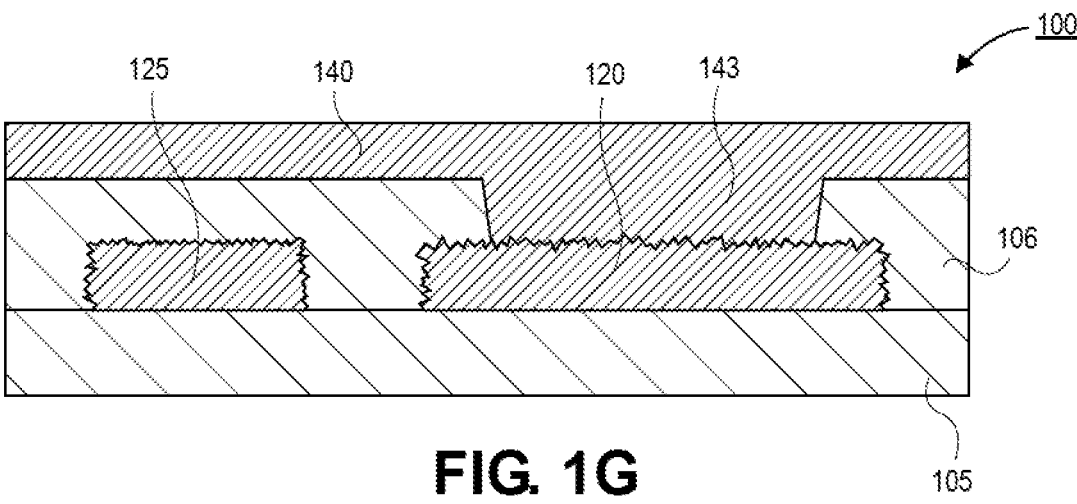

Referring now to FIG. 1G, a cross-sectional illustration of the electronic package 100 after the via 143 and trace 140 are formed over the second dielectric layer 106 is shown. The via 143 and the trace 140 may be formed with any suitable plating process. For example, an electroplating process may be used to form the via 143 and the trace 140.

In the process flow shown above with respect to FIGS. 1A-1G, a semi-additive process (SAP) is used. However, the requirement for using a roughened surface makes such an architecture non-suitable for HSIO applications. Unfortunately, when smooth surfaces are used for the pads and traces, the adhesion between the conductive features and the overlying dielectric layer is sub-optimal. This can lead to delamination defects in the electronic package.

Accordingly, embodiments disclosed herein include the use of an adhesion promoting layer that is provided over the surfaces of the conductive features. An example of an embodiment with a typical adhesion promoting layer is shown in FIGS. 2A-2G.

Figure 2A:
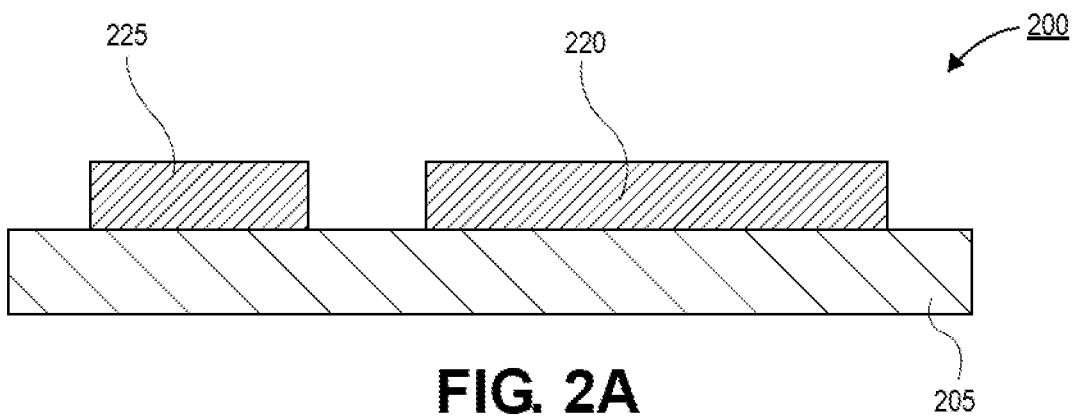
FIGS. 2A-2G are cross-sectional illustrations depicting a process for forming a via over a trace that includes an adhesion promoting layer over the trace, in accordance with an embodiment.

Referring now to FIG. 2A, and electronic 200 package is shown, in accordance with an embodiment. In an embodiment, the electronic package 200 may include a dielectric layer 205. The dielectric layer 205 may be the first dielectric layer 205 or there may be other dielectric layers below the first dielectric layer 205. In some embodiments, a package core (not shown) may be provided below the first dielectric layer 205. The dielectric layer 205 may be an organic material. For example, the first dielectric layer 205 may comprise an epoxy or the like.

A trace 225 and a trace 220 may be provided over the first dielectric layer 205. As shown, the trace 225 extends into and out of the plane of FIG. 2A. The trace 220 may be coupled to a trace (not shown) over the first dielectric layer 205. For example, the trace coupled to the trace 220 may extend into the plane of FIG. 2A. In an embodiment, the trace 225 and the trace 220 may comprise an electrically conductive material. For example, the trace 225 and the trace 220 may comprise copper or the like.

Figure 2B:
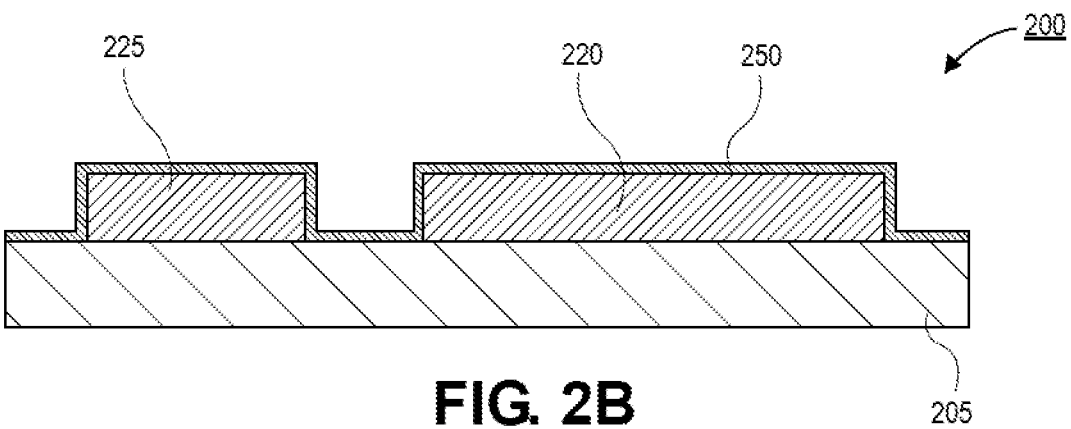

Referring now to FIG. 2B, a cross-sectional illustration of the electronic package 200 after an adhesion promoting layer 250 is provided over the first dielectric layer 205 and the conductive trace 220 and trace 225 is shown, in accordance with an embodiment. In an embodiment, the adhesion promoting layer 250 may be deposited with a blanket deposition process. For example, a sputtering process or the like may be used to deposit the adhesion promoting layer 250. In an embodiment, the adhesion promoting layer 250 may comprise a material that improves the adhesion between the conductive features 220 and 225 and a subsequently added second dielectric layer (not shown in FIG.

2B). For example, the adhesion promoting layer 250 may comprise silicon and nitrogen (e.g., $SiN_x$). In an embodiment, the adhesion promoting layer 250 may have a thickness that is approximately 5 μm or less. In a particular embodiment, the adhesion promoting layer 250 may have a thickness that is approximately 1 μm or less. As used herein, "approximately" may refer to a range that is plus or minus ten percent of the stated value. For example approximately 1 μm may refer to a range between 0.9 μm and 1.1 μm.

As shown in FIG. 2B, the adhesion promoting layer 250 may be deposited on the conductive features 220 and 225 without roughening the conductive features 220 and 225. That is, a roughness of the surfaces of the trace 220 and the trace 225 may be approximately 6 μm or less or even 1 μm or less. The reduced surface roughness, compared to the example described above with respect to FIGS. 1A-1G allows for improved electrical performance, especially at high frequencies used for HSIO devices.

Figures 2C, 2D, 2E:
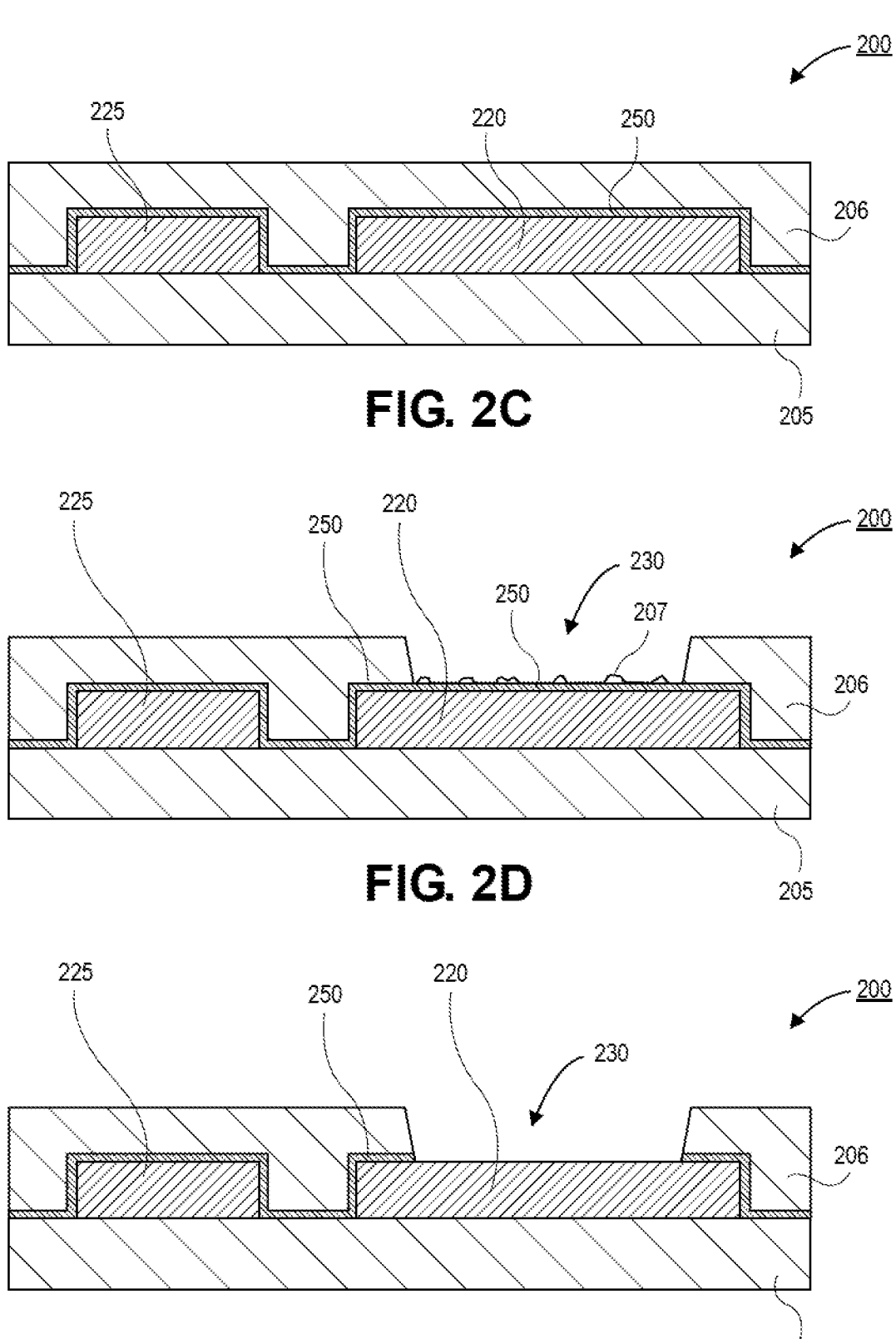

Referring now to FIG. 2C, a cross-sectional illustration of the electronic package 200 after a second dielectric layer 206 is disposed over the conductive features 220 and 225 and the first dielectric layer 205 is shown, in accordance with an embodiment. In an embodiment, the second dielectric layer 206 may be substantially similar to the first dielectric layer 205. For example, the second dielectric layer 206 may be an organic material, such as an epoxy or the like.

In an embodiment, the adhesion promoting layer 250 may improve the adhesion between the trace 220 and the trace 225, and the second dielectric layer 206. In some embodiments, the adhesion promoting layer 250 may be in an as-deposited state. In such embodiments, the main adhesion promoting feature is hydrogen bonding between the adhesion promoting layer 250 and the second dielectric layer 206. In some applications, this level of adhesion improvement is suitable. However, in other embodiments, a stronger adhesion is needed. The stronger adhesion can be generated by switching the hydrogen bonding sites into covalent bonding sites. As described in greater detail below, several processes are provided in order to provide covalent bonding at the interface between the adhesion promoting layer 250 and the second dielectric layer 206. However, after the treatment of the adhesion promoting layer 250 the process flow may continue substantially similar to what is described in FIGS. 2A-2G.

Referring ow to FIG. 2D, a cross-sectional illustration of the electronic package 200 after a via opening 230 is formed into the second dielectric layer 206 is shown, in accordance with an embodiment. In an embodiment, the via opening 230 may be formed with a laser drilling process. However, it is to be appreciated that other material removal processes may be used to form the via opening 230 in other embodiments. When formed with a laser drilling process, the sidewalls of the via opening 230 may be tapered. In an embodiment, the laser drilling process may leave residue or other portions 207 of the second dielectric layer 206 over the surface of the adhesion promoting layer 250.

Referring now to FIG. 2E, a cross-sectional illustration of the electronic package 200 after a desmear process is shown, in accordance with an embodiment. In an embodiment, the desmear process may clean off the surface of the trace 220. For example, the desmear may completely remove the residue or other portions 207 of the second dielectric layer 206. Additionally, the desmear process may result in the removal of the adhesion promoting layer 250 over the trace 220. That is, the adhesion promoting layer 250 may not completely cover the top surface of the trace 220. As such, an opening in order to form electrical contact to the trace 220 is provided.

In an embodiment, the desmear process may be a wet process (i.e., a wet etch) or a dry process (i.e., a dry etch). Wet processes are preferable in terms of manufacturing costs. For example, a dry process may require additional tooling in the fabrication facility in order to accommodate dry etching, while wet etching infrastructure may already be present in the fabrication facility. However, as will be described in greater detail below, the use of a wet etching process has the potential to damage the interface between the adhesion promoting layer 250 and the second dielectric layer. Particularly, when a wet etching process is used for the desmear, it may be necessary to functionalize the adhesion promoting layer 250 in order to allow for covalent bonding, as will be described in greater detail below.

Figures 2F, 2G:
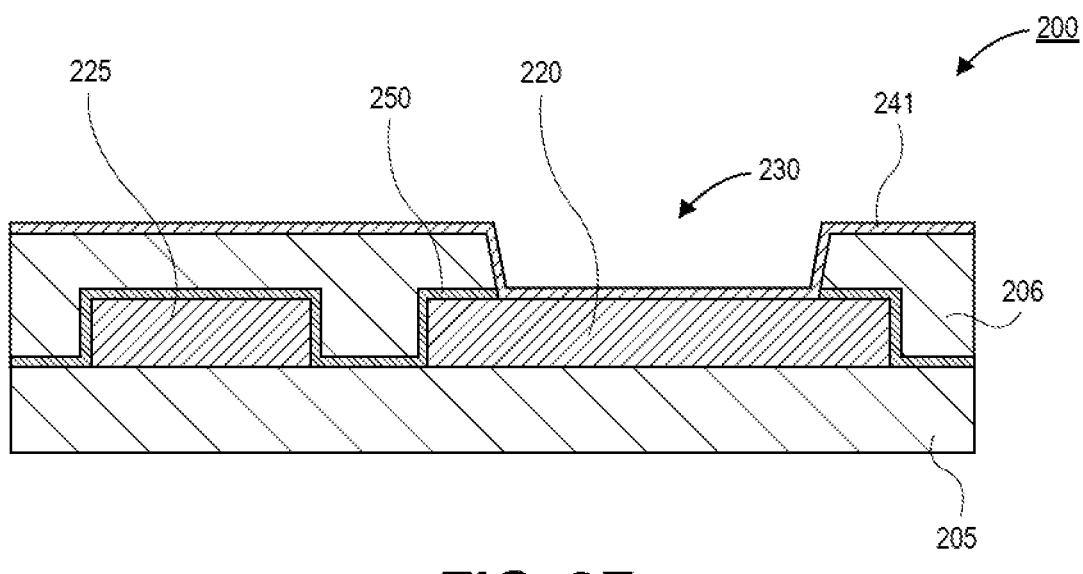

Referring now to FIG. 2F, a cross-sectional illustration of the electronic package 200 after a seed layer 241 is deposited is shown, in accordance with an embodiment. The seed layer 241 may be a copper seed layer 241. Though, it is to be appreciated that other seed layer materials may also be used. In an embodiment, the seed layer 241 is provided over the top surface of the second dielectric layer 206 and over the sidewalls of the via opening 230. The seed layer 241 may also be formed over the exposed surface of the trace 220 in some embodiments. The seed layer 241 may be deposited with any suitable deposition process.

Referring now to FIG. 2G, a cross-sectional illustration of the electronic package 200 after the via 243 and trace 240 are formed over the second dielectric layer 206 is shown. The via 243 and the trace 240 may be formed with any suitable plating process. For example, an electroplating process may be used to form the via 243 and the trace 240.

Figure 3:
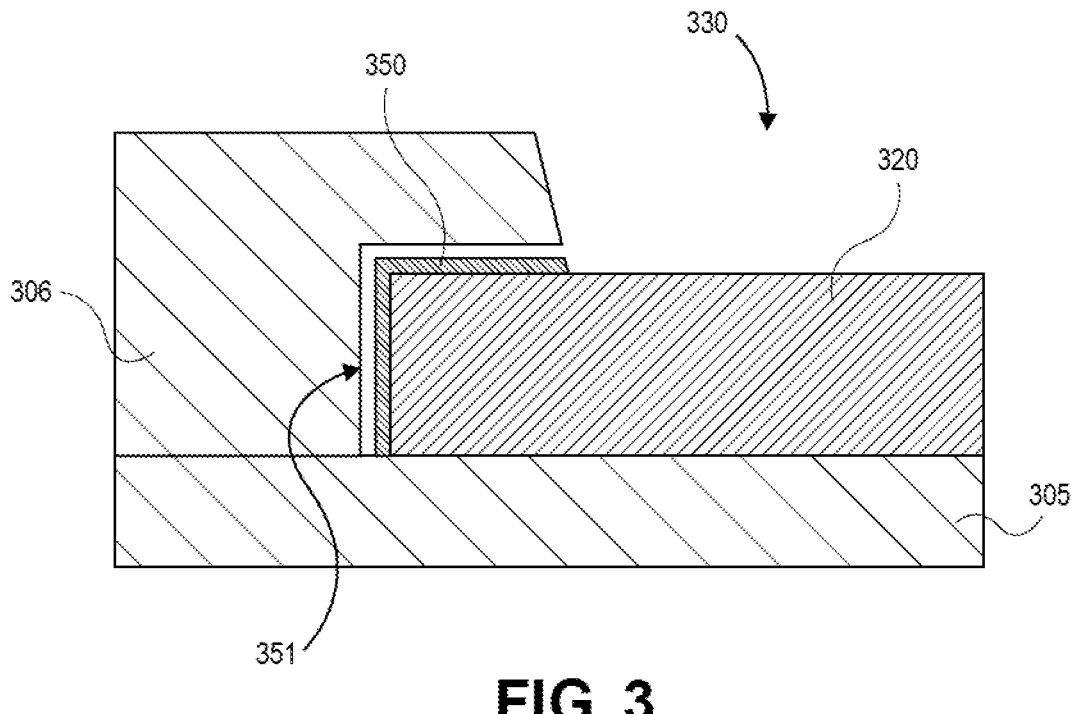
FIG. 3 is a cross-sectional illustration of an edge of a trace that illustrates a delamination defect, in accordance with an embodiment.

Referring now to FIG. 3, a cross-sectional illustration that shows the edge of a trace 320 over a first dielectric layer 305 is shown, in accordance with an embodiment. FIG. 3 is used to illustrate that even when an adhesion promoting layer 350 is used, some material processing operations may result in delamination. For example, the second dielectric layer 306 is delaminated (as indicated by gap 351) from the adhesion promoting layer 350. Such a delamination may occur when the adhesion promoting layer 350 is not functionalized to form covalent bonds. Instead, only weaker hydrogen bonding is provided at the interface between the adhesion promoting layer 350 and the second dielectric layer 306. In such instances, when wet etching is used for the desmear process, the wet etchant may leach under the second dielectric layer 306 around the sides of the trace 320 and damage the hydrogen bonds. As such, the second dielectric layer 306 may delaminate due to the poor adhesion. Accordingly, when standard adhesion promoting layers 350 are used, it may be necessary to use the more expensive dry etching process.

More generally, the stack-up of interest in embodiments disclosed herein (i.e., copper-$SiN_x$-organic dielectric) consists of three inter- or intra-face connections. A first interface is the copper to $SiN_x$ interface, a second intraface is bonding within the $SiN_x$ layer, and a third interface is bonding between the $SiN_x$ and the organic dielectric layer. $SiN_x$ is well-known as a hermetic layer with a strong bond to copper. For example, the bond energy of copper to silicon is 221 KJ/mol. However, in terms of $SiN_x$ of the organic dielectric interface, the adhesion relies only on hydrogen bonding due to the absence of reactive sites on the $SiN_x$ surface to react with the upper dielectric layer. For example, the $SiN_x$ to dielectric bond has a bond energy of only 4-13 KJ/mol. This is much lower than the strong covalent bonds within the $SiN_X$ layer that have a bond energy of 439 KJ/mol. As described above, the weak bonding at the $SiN_X$ to dielectric interface results in the interface being susceptible to wet etching chemistries. As such, more expensive dry etching processes are needed in conjunction with the $SiN_X$ adhesion promoting layers.

Therefore, embodiments disclosed herein include various mechanisms that functionalize the adhesion promoting layers. The functionalized adhesion promoting layers may include ligands that drive covalent bonds with the second dielectric layer. Such covalent bonds are not susceptible to damage like is the case with the hydrogen bonds described above. As such, the less expensive wet etching desmear process can be used.

Various functionalization processes are described in greater detail below. One such functionalization process, reactive functional groups (e.g., amines or silanols) are formed by applying a hydrofluoric acid containing solution to protonate N from $SiN_X$ on the surface to Si—$NH_2$. In addition, residual Si—F on the surface can be hydrolyzed and transfer to Si—OH under a high temperature deionized (DI) water rinse. In another embodiment, reactive functional groups (e.g., amines and silanols) are formed by a surface modification that includes reacting the surface in a plasma fed with humidified air. After the exposure to the humidified air plasma, which contains hydroxyl radicals and free hydrogen atoms (among other species), Si—N bonds at the $SiN_X$ surface are broken in favor of the more energetically favorable Si—O bonds. This creates Si—OH and Si—NH bonds on the surface. The Si—NH bonds can be further protonated, creating Si—$NH_2$. It is to be appreciated that some works have been done on the oxidation of $SiN_X$ to form amine as an intermediate with the presence of a hydrogen source (e.g., water moisture). However, such applications cannot be realistically applied to the packaging industry because the temperature required to form the amines during oxidation is too high (e.g., 800° or greater). The high temperatures are not compatible with the temperature sensitive materials (e.g., dielectrics) used in packaging applications, such as those described herein. In yet another embodiment, reactive materials (e.g., catalytic materials) and a boronic acid are added to the surface of the $SiN_X$. The presence of the catalyst can catalyze and react with epoxy in the dielectric layer to form strong covalent bonds at the interface. For example, the bonds may include cyclic boronate.

Figure 4:
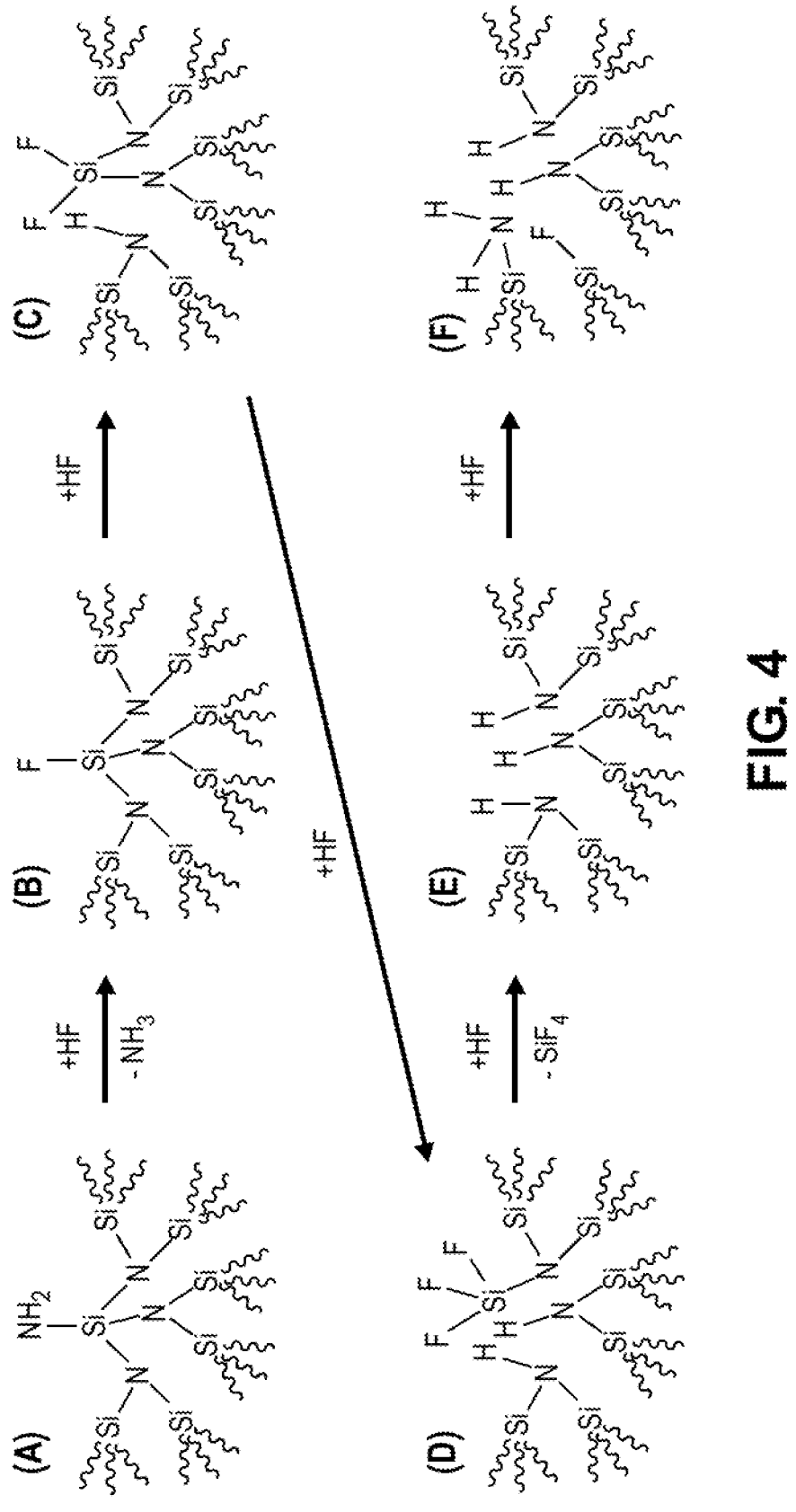
FIG. 4 are schematic illustrations (A)-(F) of a chemical reaction that functionalizes $SiN_x$ to include amine ligands, in accordance with an embodiment.

Referring now to FIG. 4, a series of chemical structures (A)-(F) in a sequence to form amine ligands on the $SiN_X$ surface is shown, in accordance with an embodiment. In FIG. 4(A), a $SiN_X$ structure is shown. The central Si atom is coupled to four N atoms. Three of the four N atoms are coupled to other Si atoms, and the fourth N atom is coupled to a pair of H atoms to form $NH_2$.

In an embodiment, a hydrofluoric acid mixture is used to treat the surface of the $SiN_X$ surface, as shown in the arrow between FIG. 4(A) and FIG. 4(B). The hydrofluoric acid mixture may be any suitable mixture. For example, the hydrofluoric acid mixture may be a buffered hydrofluoric acid (BHF). The hydrofluoric acid treatment may be used for a relatively short period of time (e.g., approximately 1 minute or less). As shown in FIG. 4(B), the hydrofluoric acid may result in the fourth $NH_2$ molecule being replaced with a fluorine atom. Now, the central Si atom is coupled to the F atom and three N atoms.

Referring now to FIG. 4(C), the hydrofluoric acid treatment is continued, and another N is stripped from the central Si. Now, the central Si atom is coupled to two F atoms and two N atoms. The third N atom has picked up a bond to H.

Referring now to FIG. 4(D), the hydrofluoric acid treatment is continued, and another N is stripped from the central Si. Now, the central Si atom is coupled to three F atoms. The released N atom picked up a hydrogen bond.

Referring now to FIG. 4(E), the hydrofluoric acid treatment is continued. This results in the central Si atom picking up another H bond. The $SiF_4$ molecule is then released (removed completely form FIG. 4(E)). This leaves behind three N atoms that are each coupled to two Si atoms and an H atom.

Referring now to FIG. 4(F), the hydrofluoric acid treatment continues, and one of the N atoms is released from one of the Si atoms. The N attached to the Si may be replaced with an F atom. As such, there is now amine ligands ($NH_2$) provided in the layer. The amine ligands are reactive to the dielectric layer in order to form covalent bonds, as will be described in greater detail below.

Figures 5, 6A, 6B:
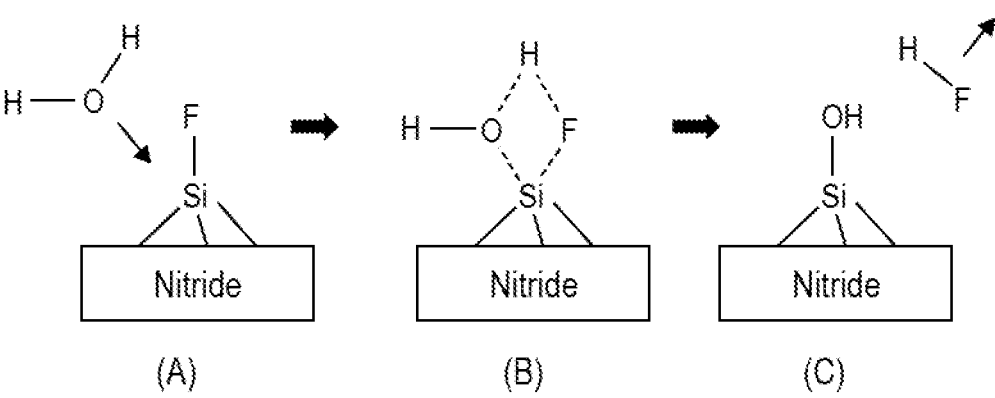
FIG. 5 are schematic illustrations (A)-(C) of a chemical reaction that forms silanol ligands on the silicon nitride surface, in accordance with an embodiment.
FIG. 6A is a chemical equation showing the linkage of an epoxy to the silanol ligand, in accordance with an embodiment.
FIG. 6B is a chemical equation showing the linkage of an epoxy to the amine ligand, in accordance with an embodiment.

Upon protonation of the $SiN_X$ surface by HF attack, the residual amount of fluorine (i.e., Si—F as depicted in FIG. 4(F)) is still left on the $SiN_X$ surface. The presence of Si—F may or may not impact the adhesion with the dielectric. To eliminate the F compound completely and form a reactive silanol (Si—OH) ligand, which will be reactive with epoxy to form a strong covalent bond, a hot water rinse can be applied to remove surficial Si—F. The mechanism for removing the F is shown in FIG. 5. As shown, in FIG. 5(A), water ($H_2O$) is added to the surface. As shown in FIG. 5(B), the intermediary product includes Si that is bonded to both O and F, with the O and F sharing an H bond. The conversion continues with the H and F leaving the molecule, as shown in FIG. 5(C). Accordingly, a silanol (SiOH) is left on the surface of the nitride.

At this point, the surface of the treated adhesion promoting layer includes reactive ligands, such as silanol and amines. Those ligands are chemically reactive with epoxy in order to form covalent bonds. FIGS. 6A and 6B show the chemical reactions. As shown in FIG. 6A, a silanol reacts with an epoxy to form an Si—O—$CH_2$ bond. Similarly, FIG. 6B shows an amine reacting with an epoxy to form an $R_1$—NH—$CH_2$ bond. Both bonds are covalent in nature and provide for stronger bonds than simple hydrogen bonding present in an adhesion promoter layer that is untreated. As such, wet etching processes can be used for the desmear without worrying about delamination defects.

Figure 7:
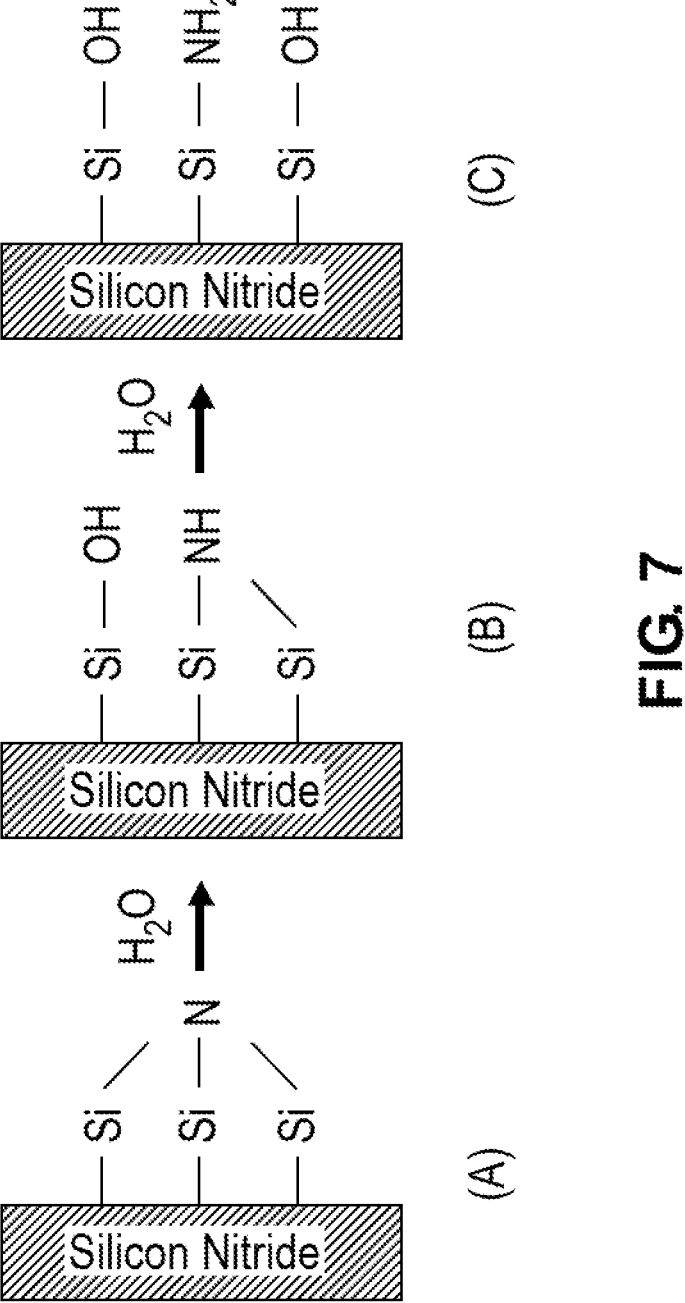
FIG. 7 are schematic illustrations (A)-(C) of a chemical reaction that forms silanol and amine ligands on the surface of the silicon nitride, in accordance with an embodiment.

In another embodiment, the reactive ligands can be formed through the use of a plasma treatment process. The plasma treatment process may include moisture (e.g., humidified air) in order to replace Si—N bonds with silanol (Si—OH) bonds. An example of the chemical process is shown in FIG. 7. At FIG. 7(A), a silicon nitride material has a surface that comprises Si—N bonds, with each N bonded to three silicon atoms. As shown by the arrow, $H_2O$ is added to the environment. For example, the $H_2O$ may be added in a plasma treatment process. In a particular embodiment, the plasma treatment process is a radio frequency glow discharge plasma fed with humidified air. The plasma may comprise hydroxyl radicals and free hydrogen atoms, among other species. As shown in FIG. 7(B), the Si—N bonds are broken in favor of the more energetically favorable Si—O bonds, creating Si—OH and Si—NH on the surface. The Si—NH bond in FIG. 7(B) may further be protonated as shown in FIG. 7(C) in order to create Si—$NH_2$ amine ligands. Accordingly, the surface of the adhesion promoting layer may be covered by silanol and amine ligands that are reactive with epoxy. The reaction to form the covalent bonds may be substantially similar to the reactions described above with respect to FIGS. 6A and 6B.

In yet another embodiment, reactive materials (e.g., catalysts) are provided in the adhesion promoting layer. The reactive materials may include materials such as palladium (Pd), phosphorous (P), and/or boron (B). In a particular embodiment, a catalyst may comprise tetrakis(triphenylphosphine)palladium ($Pd(PPH_3)_4$). The reactive materials may be either distributed through a thickness of the adhesion promoting layer, or provided only at the surface of the adhesion promoting layer. In an embodiment, the reactive materials may be coupled with a boronic acid. The presence of the reactive materials with the boronic acid can catalyze and react with epoxy in the dielectric layer to form strong covalent bonds at the interface. Thus, the interface between $SiN_X$ and the organic dielectric is composed of strong chemical bonds, as compared with the original hydrogen bonding type, and improve the interfacial adhesion, reliability, and compatibility with the more cost effective wet etch processes described above.

Figure 8:
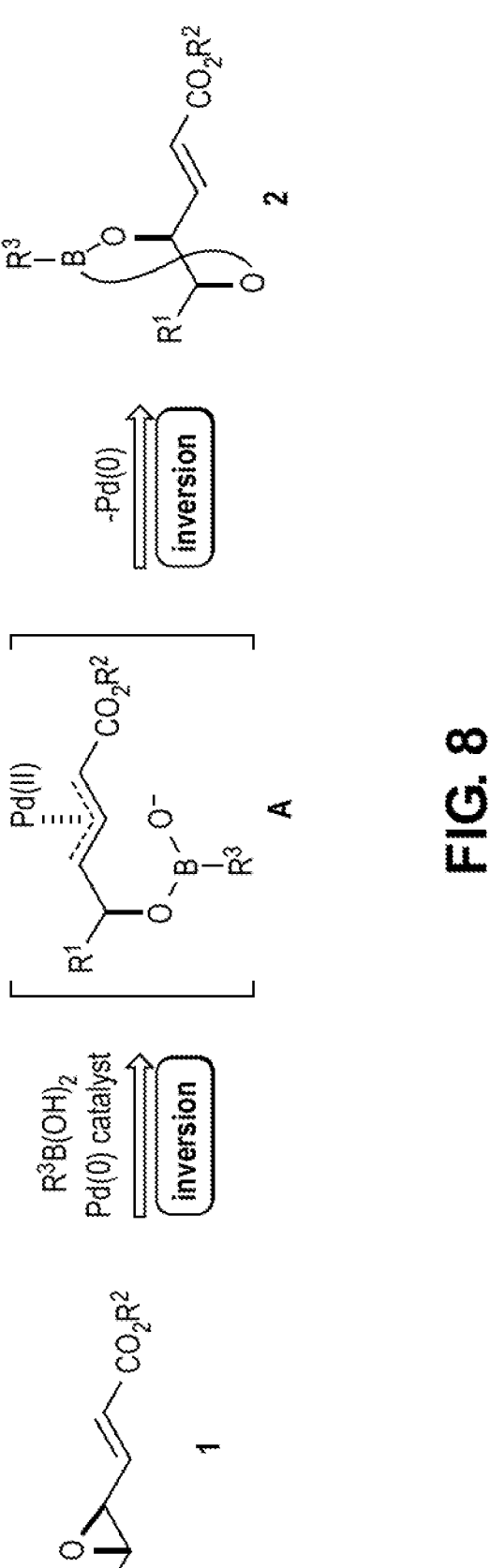
FIG. 8 is a schematic illustration of a chemical reaction of an epoxide-opening reaction with double inversion of the configuration and formation of cyclic boronate, in accordance with an embodiment.

Referring now to FIG. 8, a chemical equation showing the reaction that produces the stronger chemical bonds at the surface of the adhesion promoting layer is shown, in accordance with an embodiment. As shown, Pd (catalyst) and a boronic acid are used to produce an intermediary product A and ultimately compound 2. More particularly, and without being tied to any particular mechanism, it is presumed that the palladium-catalyzed reaction of epoxy unsaturated ester 1 with a boronic acid forms the p-allyl palladium intermediate A involving a boronate moiety which undergoes an intermolecular substitution reaction at the g-position with elimination of palladium to afford the cyclic boronate of the g,d-vicinal diol 2. It is to be appreciated that any suitable boronic acid may be used. For example, the boronic acid $R^3B(OH)_2$ may include one or more of syn-phenylboronic acid ($PhB(OH)_2$), pentafluorophenylboronic acid ($C_6F_5B(OH)_2$), butylboronic acid ($BuB(OH)_2$), trimethylsilylmethylboronic acid ($TMSCH_2B(OH)_2$), and any other derivatives of the boronic acid family.

As the embodiments disclosed herein refer to surface treatments of the adhesion promoting layer, it may be difficult to identify specific architectures that indicate the use of certain embodiments. However, it has been shown that certain analytical techniques can be used to identify features described and claimed herein.

Figure 9A:
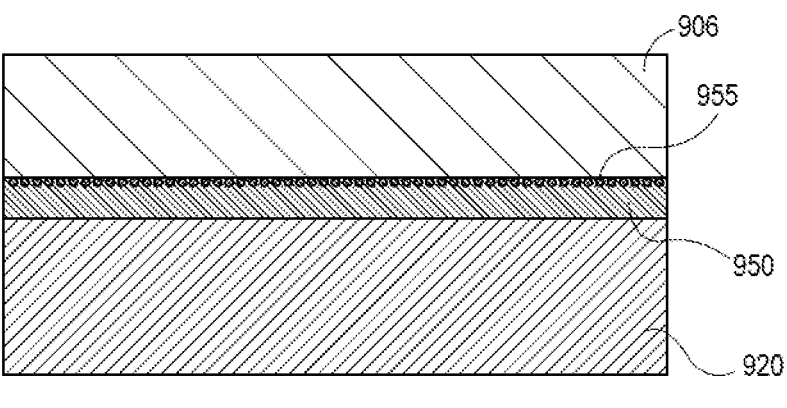
FIG. 9A is a cross-sectional illustration of an adhesion promoting layer between a copper trace and a dielectric, where the adhesion promoting layer includes amine structures that are tagged with fluorine-containing molecules, in accordance with an embodiment.

With respect to the embodiments that form amine ligands, the presence of the amine may be detected. Particularly, the amine-containing interface for the modified $SiN_X$ surface can be detected by labeling with fluorine-containing small molecules (e.g., 4-(trifluoromethyl)benzaldehyde (TFMB). This is a well-known method for amine labeling and can be used to detect the presence of the amines at the surface. For example, as shown, in FIG. 9A, fluorine tags 955 at the surface of the adhesion promoting layer 950 can be used to determine amine formation was used to aid in the adhesion of the dielectric layer 906 to the copper layer 920. The labeled fluorine can be detected from the cross-section of the stack-up layers, where the amine from the $SiN_X$ dielectric interface is differentiated from other N-containing compound (e.g., $SiN_X$ or organic compounds in the dielectric). Verifications of tagged fluorine at the interface can be detected by either XPS or EDS assisted SEM or TEM at the atomic scale. Ultramicrotomy techniques can be used to prepare ultra-thin cross-sectional samples for TEM analysis supplemented by elemental confirmation with an EDS scan.

Figure 9B:
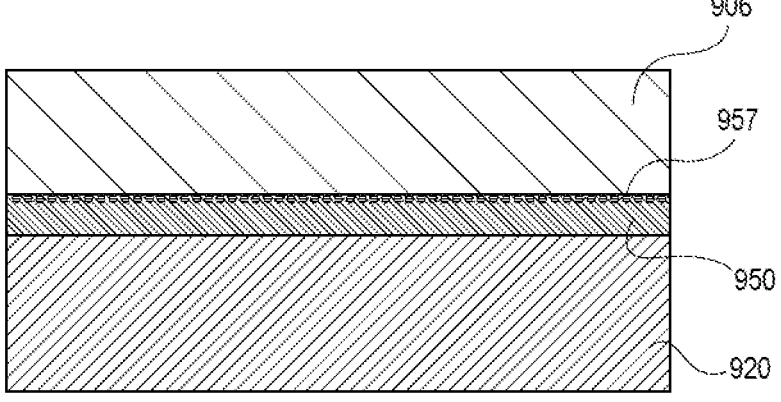
FIG. 9B is a cross-sectional illustration of an adhesion promoting layer that includes catalysts at the interface between the adhesion promoting layer and the dielectric layer, in accordance with an embodiment.
Figure 9C:
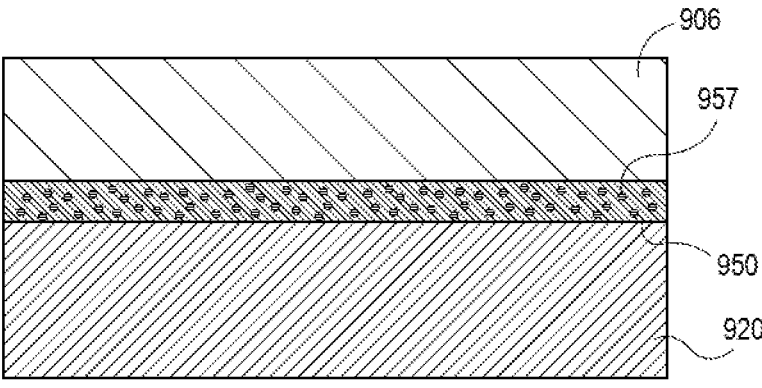
FIG. 9C is a cross-sectional illustration of an adhesion promoting layer that includes catalysts through a thickness of the adhesion promoting layer, in accordance with an embodiment.

With respect to the embodiments that include a catalyst to drive the chemical reaction, embodiments will leave behind the catalyst (e.g., Pd, P, and/or B), which can be detected in XPS and EDS assisted SEM and/or TEM. Ultramicrotomy techniques can be used to prepare ultra-thin cross-sectional samples for TEM analysis supplemented by elemental confirmation with an EDS scan. As shown in FIG. 9B, the catalyst 957 may be provided at the surface of the adhesion promoting layer 950. In other embodiments, the catalyst 957 may be provided through a thickness of the adhesion promoting layer 950, as shown in FIG. 9C.

Figure 10:
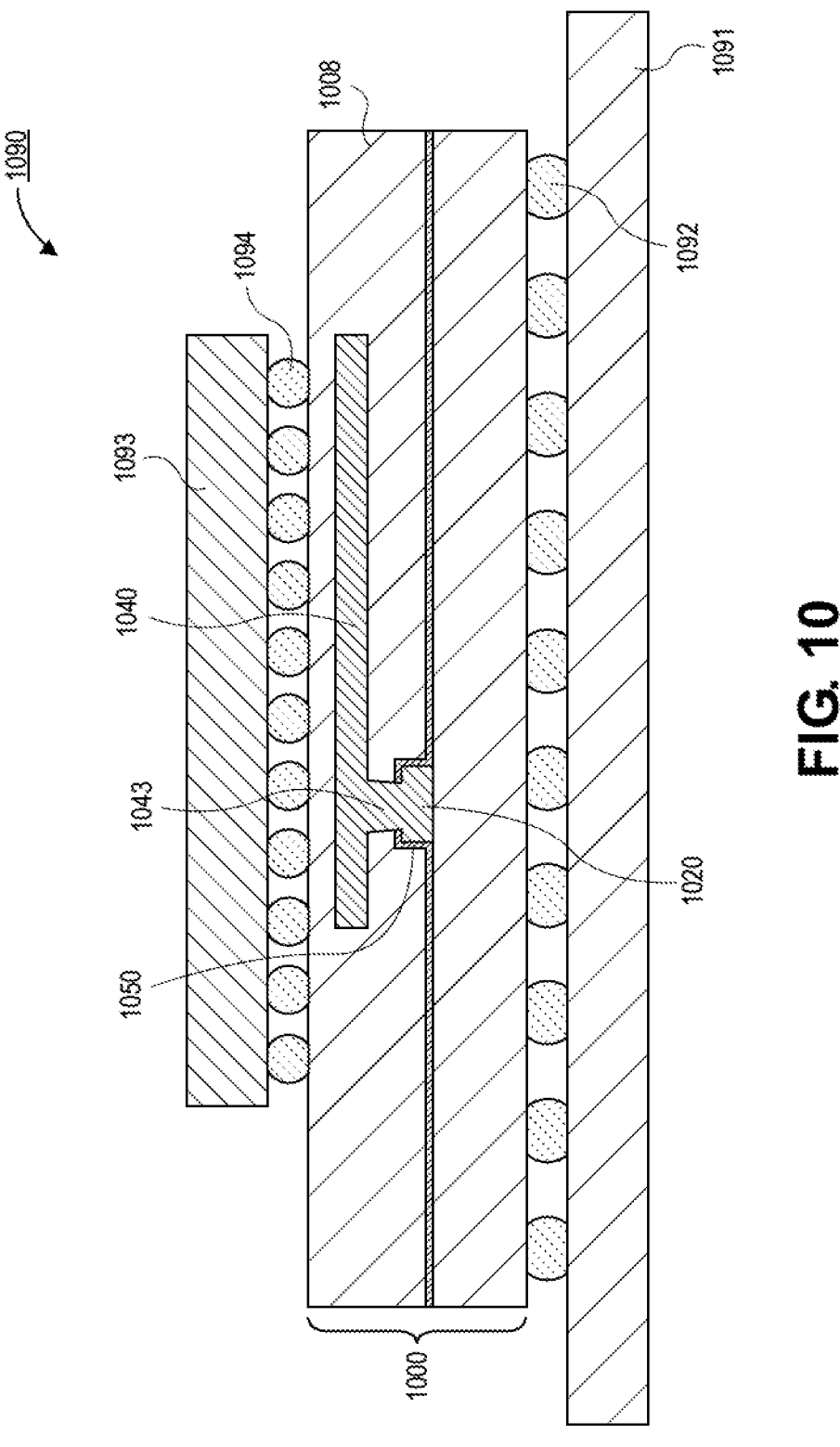
FIG. 10 is a cross-sectional illustration of an electronic system with an electronic package that includes a copper trace with an adhesion promoting layer, in accordance with an embodiment.

Referring now to FIG. 10, a cross-sectional illustration of an electronic system 1090 is shown, in accordance with an embodiment. In an embodiment, the electronic system 1090 may comprise a board 1091, such as a printed circuit board (PCB). The board 1091 may be coupled to an electronic package 1000 by interconnects 1092. The interconnects 1092 are shown as solder balls, but it is to be appreciated that any interconnect architecture may be used.

In an embodiment, the electronic package 1000 comprises a package substrate 1008. The package substrate 1008 may comprise a plurality of laminated organic dielectric layers. In an embodiment, one of the organic dielectric layers may be laminated over a trace 1020, such as a copper trace 1020. In an embodiment, the copper trace 1020 is a smooth copper trace. That is, there is no surface roughening in the copper trace 1020 or any attached traces (not shown) The trace 1020 may have a high level of adhesion to the package substrate 1008 through the use of an adhesion promoting layer 1050. The adhesion promoting layer 1050 may be similar to any of the adhesion promoting layers described in greater detail above. For example, the adhesion promoting layer 1050 may be functionalized with amines and/or silanols. Alternatively, catalysts may be in or on the adhesion promoting layer 1050. In an embodiment, a via 1043 couples the trace 1020 to an overlying trace 1040. The trace 1040 may also be a smooth copper feature. While not shown, an additional adhesion promoting layer 1050 may be provided between the trace 1040 and the package substrate 1008.

In an embodiment, a die 1093 may be coupled to the package substrate 1008 by interconnects 1094. While shown as solder balls, it is to be appreciated that interconnects 1094 may be any interconnect architecture. In an embodiment, the die 1093 is a processor, a graphics processor, a memory device, or any other type of active die. Additionally, while a single die 1093 is shown, it is to be appreciated that embodiments may include multi-die 1093 architectures.

Figure 11:
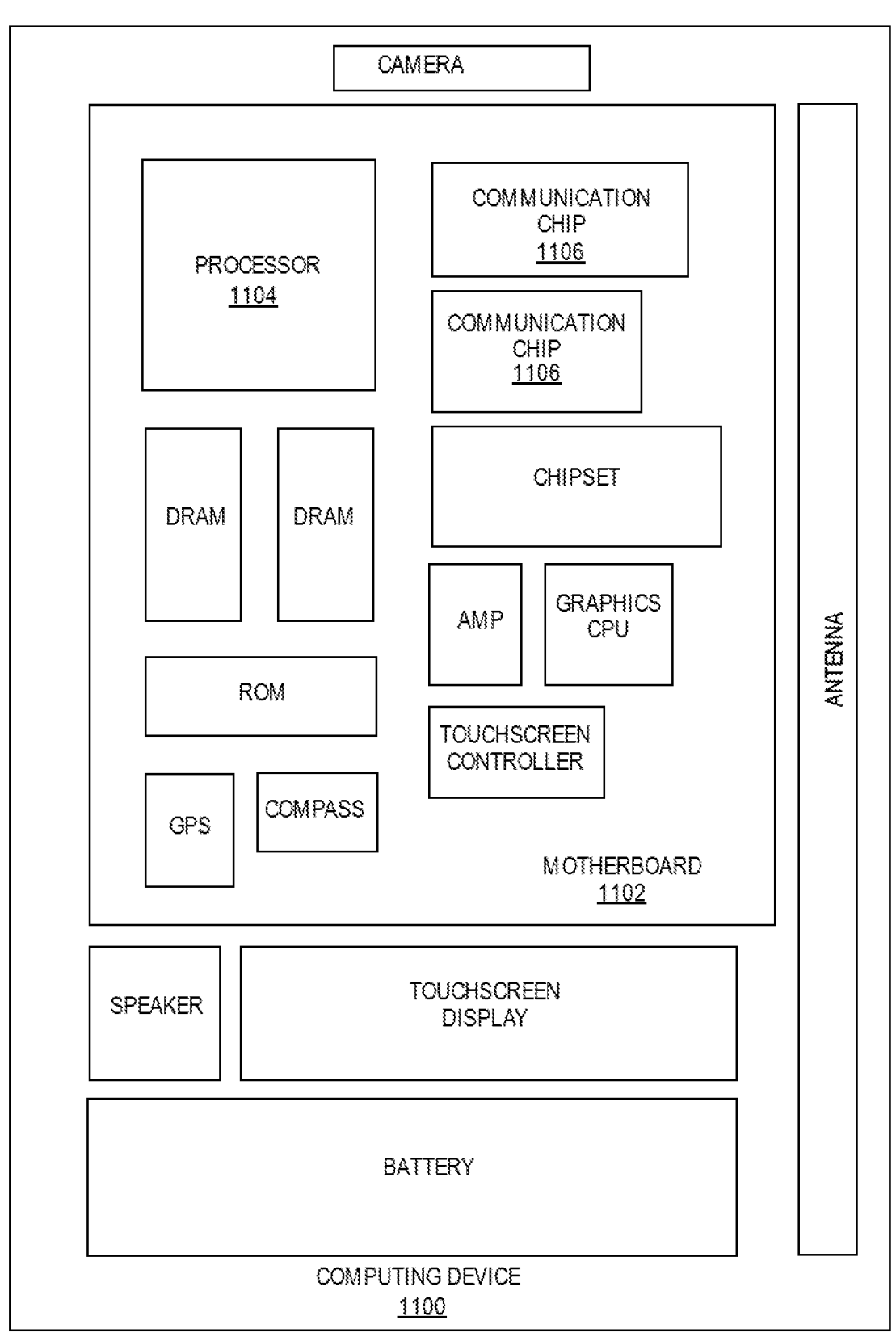
FIG. 11 is a schematic of a computing device built in accordance with an embodiment.

FIG. 11 illustrates a computing device 1100 in accordance with one implementation of the invention. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the invention, the integrated circuit die of the processor may be part of an electronic package that includes conductive features that are coupled to organic dielectrics with an adhesion promoting layer, in accordance with embodiments described herein. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of the invention, the integrated circuit die of the communication chip may be part of an electronic package that includes conductive features that are coupled to organic dielectrics with an adhesion promoting layer, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate with a plurality of first layers, wherein the first layers comprise an organic material; a trace embedded in the package substrate; and a second layer over the trace, wherein the second layer comprises silicon and nitrogen, and wherein the second layer is chemically bonded to the one of the first layers.

Example 2: the electronic package of Example 1, wherein the second layer is chemically bonded to the one of the first layers by an oxygen to carbon covalent bond.

Example 3: the electronic package of Example 1, wherein the second layer is chemically bonded to the one of the first layers by a nitrogen to carbon covalent bond.

Example 4: the electronic package of Example 1, wherein the second layer comprises amine ligands at a surface between the second layer and the first layer.

Example 5: the electronic package of Example 4, wherein ones of the amine ligands are labeled with fluorine-containing molecules.

Example 6: the electronic package of Example 5, wherein the fluorine-containing molecules comprise 4-(trifluoromethyl)benzaldehyde (TFMB).

Example 7: the electronic package of Example 5 or Example 6, wherein the interface between the second layer and the one of the first layers comprises oxygen and nitrogen.

Example 8: electronic package of Examples 1-7, wherein the second layer is not continuous over a surface of the trace.

Example 9: the electronic package of Example 8, wherein the second layer is over a top surface of the trace and sidewall surfaces of the trace.

Example 10: the electronic package of Example 8 or Example 9, further comprising: a via through the first layer and contacting a top surface of the trace.

Example 11: the electronic package of Examples 1-10, wherein a surface of the trace has a roughness that is less than approximately 1 μm.

Example 12: a method of fabricating an electronic package, comprising: forming a trace on a first layer, wherein the first layer is an organic dielectric; forming a second layer over the trace, wherein the second layer comprises silicon and nitrogen; treating the second layer with an acid to form amine ligands at the surface of the second layer; and disposing a third layer over the trace, wherein the third layer is the organic dielectric.

Example 13: the method of Example 12, further comprising: treating the second layer with $H_2O$ after the acid treatment in order to convert silicon fluoride ligands to silanol ligands.

Example 14: the method of Example 12 or Example 13, wherein the acid is a buffered hydrofluoric acid (BHF).

Example 15: the method of Example 12, further comprising: forming an opening through the third layer; cleaning the opening with a wet etch desmear process.

Example 16: the method of Example 15, wherein exposed portions of the second layer are removed by the wet etch desmear process.

Example 17: the method of Examples 12-16, wherein the third layer is covalently bonded to the second layer.

Example 18: the method of Example 17, wherein the covalent bonds comprise oxygen-to-carbon bonds and/or nitrogen-to-carbon bonds.

Example 19: an electronic system, comprising: a board; an electronic package coupled to the board, wherein the electronic package comprises: a package substrate with a plurality of first layers, wherein the layers comprise an organic material; a trace embedded in the package substrate; and a second layer over the trace, wherein the second layer comprises silicon and nitrogen, and wherein the second layer is chemically bonded to the one of the first layers; and a die coupled to the electronic package.

Example 20: the electronic system of Example 19, wherein the second layer is chemically bonded to the one of the first layers by an oxygen to carbon covalent bond and/or a nitrogen to carbon covalent bond.

What is claimed is:

1. An electronic package, comprising:
a package substrate with a first layer, wherein the first layer comprises an organic material;
a trace embedded in the package substrate; and
a second layer over the trace, wherein the second layer comprises silicon and nitrogen, wherein the second layer is chemically bonded to the first layer, wherein the second layer comprises amine ligands at a surface between the second layer and the first layer, and wherein ones of the amine ligands are labeled with fluorine-containing molecules.

2. The electronic package of claim 1, wherein the second layer is chemically bonded to the first layer by an oxygen to carbon covalent bond.

3. The electronic package of claim 1, wherein the second layer is chemically bonded to the first layer by a nitrogen to carbon covalent bond.

4. The electronic package of claim 1, wherein the fluorine-containing molecules comprise 4-(trifluoromethyl) benzaldehyde (TFMB).

5. The electronic package of claim 1, wherein the interface between the second layer and the first layer comprises oxygen and nitrogen.

6. The electronic package of claim 1, wherein the second layer is not continuous over a surface of the trace.

7. The electronic package of claim 6, wherein the second layer is over a top surface of the trace and sidewall surfaces of the trace.

8. The electronic package of claim 6, further comprising:
a via through the first layer and contacting a top surface of the trace.

9. The electronic package of claim 1, wherein a surface of the trace has a roughness that is less than approximately 1 µm.

10. An electronic system, comprising:
a board;
an electronic package coupled to the board, wherein the electronic package comprises:
a package substrate with a first layer, wherein the first layer comprises an organic material;
a trace embedded in the package substrate; and
a second layer over the trace, wherein the second layer comprises silicon and nitrogen, wherein the second layer is chemically bonded to the first layer, wherein the second layer comprises amine ligands at a surface between the second layer and the first layer, and wherein ones of the amine ligands are labeled with fluorine-containing molecules; and
a die coupled to the electronic package.

11. The electronic system of claim 10, wherein the second layer is chemically bonded to the first layer by an oxygen to carbon covalent bond and/or a nitrogen to carbon covalent bond.

* * * * *